(12) United States Patent
Krol (10) Patent No.: US 12,106,993 B2
(45) Date of Patent: Oct. 1, 2024

(54) METHOD AND DEVICE FOR ALIGNING SUBSTRATES

(71) Applicant: EV Group E. Thallner GmbH, St. Florian am Inn (AT)

(72) Inventor: Jozsef Krol, Passau (DE)

(73) Assignee: EV Group E. Thallner GmbH, St. Florian am Inn (AT)

( * ) Notice: Subject to any disclaimer, the term of this patent is extended or adjusted under 35 U.S.C. 154(b) by 133 days.

(21) Appl. No.: 17/783,163

(22) PCT Filed: Dec. 10, 2019

(86) PCT No.: PCT/EP2019/084471
§ 371 (c)(1),
(2) Date: Jun. 7, 2022

(87) PCT Pub. No.: WO2021/115574
PCT Pub. Date: Jun. 17, 2021

(65) Prior Publication Data
US 2023/0018538 A1 Jan. 19, 2023

(51) Int. Cl.
*G03F 7/20* (2006.01)
*G01B 11/27* (2006.01)
(Continued)

(52) U.S. Cl.
CPC .......... *H01L 21/681* (2013.01); *G01B 11/272* (2013.01); *H01L 23/544* (2013.01); *H01L 2223/54426* (2013.01)

(58) Field of Classification Search
CPC ................ H01L 21/681; H01L 23/544; H01L 2223/54426; H01L 21/187;
(Continued)

(56) References Cited

U.S. PATENT DOCUMENTS 6,214,692 B1  4/2001  Thallner
8,454,771 B2  6/2013  Horikoshi
(Continued)

FOREIGN PATENT DOCUMENTS

EP  2612109 B1  7/2013
EP  2656378 B1  3/2015
(Continued)

OTHER PUBLICATIONS

Hansen Friedrich. *Justierung Eine Einf. in D. Wesen D. Justierung Von Techn. Gebilden.* 2. überarb. Aufl ed. Verlag Technik VEB 1967, pp. 136-139 (with English-language translation).
(Continued)

*Primary Examiner* — Mesfin T Asfaw
(74) *Attorney, Agent, or Firm* — KUSNER & JAFFE (57) ABSTRACT

A device and a method for aligning substrates. The method includes the steps of detecting alignment marks and aligning substrates with respect to one another in dependence on the detection of the alignment marks. At least two alignment marks are arranged parallel to a direction of a linear movement of the substrates, wherein the alignment of the substrates takes place along a single alignment axis, the alignment axis running parallel to the loading and unloading direction of the substrates.

20 Claims, 3 Drawing Sheets

(51) Int. Cl.
  *H01L 21/68* (2006.01)
  *H01L 23/544* (2006.01)
(58) Field of Classification Search
  CPC ........ H01L 21/67259; H01L 21/67092; G01B 11/272; G03F 9/7011
  See application file for complete search history.

(56) References Cited

U.S. PATENT DOCUMENTS

| | | |
|---|---|---|
| 9,299,620 B2 | 3/2016 | Horikoshi |
| 9,418,882 B2 | 8/2016 | Thallner |
| 10,954,122 B2 | 3/2021 | Wagenleitner et al. |
| 2010/0139836 A1 | 6/2010 | Horikoshi |
| 2012/0237328 A1* | 9/2012 | Figura ............... H01L 21/67092 414/800 |
| 2013/0244350 A1 | 9/2013 | Horikoshi |
| 2015/0231873 A1* | 8/2015 | Okamoto ................ B32B 41/00 156/64 |
| 2016/0020136 A1 | 1/2016 | Thallner et al. |
| 2016/0148826 A1 | 5/2016 | Thallner |
| 2020/0055729 A1 | 2/2020 | Wagenleitner et al. |

FOREIGN PATENT DOCUMENTS

| | | |
|---|---|---|
| EP | 2913841 A1 | 9/2015 |
| JP | 2009-054962 A | 3/2009 |
| JP | 2011-049450 A | 3/2011 |
| JP | 2011-222855 A | 11/2011 |
| JP | 2012-231063 A | 11/2012 |
| JP | 2014-030025 A | 2/2014 |
| JP | 2014-168089 A | 9/2014 |
| JP | 2016-529691 A | 9/2016 |
| JP | 2020-511784 A | 4/2020 |
| WO | WO2010/023935 A1 | 3/2010 |
| WO | WO2014/154272 A1 | 10/2014 |
| WO | WO2014/191033 A1 | 12/2014 |
| WO | WO2014/202106 A1 | 12/2014 |
| WO | WO2015/082020 A1 | 6/2015 |
| WO | WO2018/041326 A1 | 3/2018 |
| WO | WO2019/057286 A1 | 3/2019 |

OTHER PUBLICATIONS

International Search Report from corresponding International Patent Application No. PCT/EP19/84471, dated Aug. 27, 2020.
Office Action issued in related Japanese Patent Application No. 2022-532112 dated Dec. 20, 2023.

* cited by examiner

METHOD AND DEVICE FOR ALIGNING SUBSTRATES

FIELD OF INVENTION

The invention relates to a method and a device for aligning substrates according to the coordinate claims.

BACKGROUND OF INVENTION

The progressive miniaturization in virtually all sectors of microelectronics and microelectromechanical systems ensures a steady development of all technologies, with the aid of which one may increase the density of all types of functional units on substrates. For example, these functional units include microcontrollers, memory modules, MEMS, all types of sensors or microfluidic components.

In recent years, the technologies for increasing the lateral density of these functional units were greatly improved. In a few subfields of microelectronics or microelectromechanical systems technology, this is even to the extent that a further increase in the lateral density of the functional units is no longer possible. In microchip production, the maximum achievable resolution limit for structures to be produced lithographically has already practically been reached. Therefore, in a few years, physical or technological limitations will no longer allow any increase in the lateral density of functional units. The industry has already been countering this problem for a few years by developing 2.5D and 3D technologies. With the aid of these technologies, it is possible to align the same or even functional units of different types with respect to one another, stack them above one another, permanently join them to one another and interconnect them with one another by means of appropriate conductor tracks.

One of the key technologies for realizing such structures is permanent bonding. Permanent bonding is understood to mean all methods, with the aid of which substrates may be joined to one another in such a manner that the separation thereof is only possible by means of high energy outlay and an associated destruction of the substrates. Different types of permanent bonding exist, which are known to the person skilled in the art.

One of the most important permanent bonding methods is fusion bonding, also termed direct bonding or molecular bonding. Fusion bonding is understood to mean the process of permanent joining of two substrates by means of the formation of covalent bonds. Fusion bonds are created primarily on the surfaces of non-metallic-inorganic materials. Fusion bonds may proceed in a plurality of method steps: the pretreated, cleaned substrates are joined to one another by means of what are known as prebonds. In the prebonding method, two substrates alone are bonded to one another by means of van der Waals forces. This bonding process takes place primarily between silicon substrates and/or silicon oxide substrates. The bonding process joins a first substrate surface to be bonded of a first substrate to a second substrate surface to be bonded of a second substrate. The bond energy of the weak bond is sufficient for joining the substrates to one another in an immovable manner. The prebond allows a destruction-free, particularly damage-free separation of the mutually joined substrates, however. Only with a heat treatment is the prebond converted into an inseparable join of the substrates.

The clamping of the substrates, which are aligned with respect to one another, can take place purely mechanically if required, initially or after the prebond. In a particular embodiment, the substrates are preferably clamped to one another using a method described in the patent specification PCT/EP2013/056620. In this case, magnetically acting fixing means are used for the fast and simple fixing of the two substrates, which have been aligned with respect to one another and brought into contact. The clamping may also take place in any other manner. In particular, the substrates, which have been aligned with respect to one another, may be clamped onto a sample holder.

The prior art knows countless methods for measuring alignment marks for correct positioning of the substrates, on which the alignment marks are located, and for the subsequent bonding step. According to the prior art, substrates are aligned with respect to one another with the aid of alignment installations, particularly according to U.S. Pat. No. 6,214,692B1, WO2014202106A1 or WO2015082020A1. The alignment installation of the published document U.S. Pat. No. 6,214,692B1 may be considered the closest prior art. In this alignment installation, two optical element groups, with two optical elements opposite one another in each case, are used in order to create a system with two reference points, wherein the substrates are positioned interchangeably in relation to the system. The reference points are the points of intersection of the optical axes of two mutually opposite optical elements.

In a known device, an optical system and a rotational system are used for substrate positioning according to the principle of fold alignment, see in this regard, Hansen, Friedrich: Justierung, VEB Verlag Technik, 1964, par. 6.2.4, Umschlagmethode, bei welcher mindestens eine Messung in einer definierten Position and mindestens eine Messung in 180 Grad gedrehter, entgegengesetzt orientierter, umgeschlagener Position durchgeführt wird [Fold method, in which at least one measurement is carried out in a defined position and at least one measurement is carried out in a folded position, which is rotated through 180 degrees and oppositely orientated]. The thus-obtained measurement result is cleared of eccentricity errors in particular.

One problem to be addressed in the alignment of at least two substrates is that the movement procedures of alignment should proceed ever faster, but also ever more precisely, that is to say with lower residual positional uncertainty, so that the substrates are joined and bonded to one another in the ideal position to the greatest extent possible. These movement demands stand in contrast to one another.

Furthermore, parasitic movements and structure-based additional paths due to the device itself should be eliminated most substantially. Parasitic movements are created in particular as an effect of vibrations, thermal influences, moving loads and as a disruptive effect of electromagnetic fields on the device. Structure-based additional paths are trajectory paths of a first substrate to be bonded to a second substrate to be bonded, which are dispensed with by optimizing the device whilst retaining the alignment functionality of the device and in particular by increasing the positional accuracy. In the case of alignment devices in the prior art, the loading and unloading direction are for the most part identical to the main movement direction of the alignment of the substrates. To detect the alignment marks, both substrates travel through a length corresponding to the entire substrate diameter several times.

The design of alignment devices is based in this case on the historically developed design of a manual alignment device with two double microscopes in each case, as is disclosed in the published document U.S. Pat. No. 6,214,692B1. In this design, an ergonomic work position of the operator was taken into account and the two viewing microscopes are positioned on a normal to the main movement direction of the loading and unloading direction at the same distance from the operator.

In WO2014202106A1, the loading and unloading direction is transverse to the main movement direction of the alignment of the substrates. Short travel paths are possible for detecting the alignment marks. The positioning of the two double microscopes is substantially identical to the structure of conventional alignment devices, however.

PCT/EP2016/070289 uses additional alignment features of the substrate holder, which are combined with the substrate features and enable a more accurate alignment. The mechanical structure is realized substantially in accordance with conventional alignment devices.

The important problems with the prior art result from the design of the current alignment device. Any parasitic movement of the substrates to be aligned and/or parts of the device is damaging for alignment accuracy.

In particular, undesired movements are displacements of the relative position of the substrates with respect to one another, vibrations of the entire device and the parts thereof, parasitic movements, which are caused by moving loads (movement of masses on guideways cause transverse displacements), undesired yawing, pitching or rolling on straight guideways that are used. Furthermore, vibrations of the image acquisition elements are to be minimized, so that the need for refocusing is avoided. Generally, vibrations cause parasitic movements, which cause disruptions in a time frame of microseconds to seconds. Mechanical faults, which have thermomechanical conversion and/or thermal noises and/or thermal expansion as a cause, lead to parasitic movements. The time intervals in which these mechanical faults arise lie in the second to day range. Accordingly, detection and compensation of the mechanical faults caused is complicated.

All of the listed parasitic movements are known to the person skilled in the art in the field of mechanical engineering and mechatronics. In particular, parasitic movements influence alignment success if they constitute a systematic fault for the alignment.

These systemic faults are objectively caused by the alignment device and measuring methods. For devices in the prior art, the guiding and drive systems of the substrates and the image acquisition elements, together with the positioning and drive systems thereof may be sources of faults.

The image acquisition elements of the devices of the prior art, particularly double microscopes, which can capture a focal plane in the opposite direction, may be located at the end of open consoles. Thus, the fastening of image acquisition takes place on machine frames of what is known as an open C design. Open C designs have a stronger inclination to vibrations, which, primarily in the low-frequency range between 0.1 Hz to 1 Hz or between 0.1 Hz to 10 Hz, can only be damped with considerable constructive outlay and cannot be eliminated.

SUMMARY OF INVENTION

It is therefore an object of the present invention to provide a method and a device in which the accuracy of the alignment of substrates with respect to one another can be improved and the speed of the alignment of two substrates can be increased at the same time. As a result, a more accurate and even more efficient alignment and contacting of the substrates is enabled.

This object is achieved using the features of the coordinate claims. Advantageous developments of the invention are specified in the dependent claims. All combinations of at least two features specified in the description, the claims and/or the drawings also fall within the scope of the invention. In the case of value ranges, values lying within the limits mentioned should also be disclosed as limit values and be claimable in any desired combination.

According to the invention, a method is provided for aligning substrates, wherein a detection of alignment marks takes place and the substrates are aligned with respect to one another in dependence on the detection of the alignment marks, wherein at least two alignment marks are arranged flush with a linear movement of the substrates.

Furthermore, according to the invention, a device is provided for aligning substrates and for carrying out the method according to the invention, wherein a detection of alignment marks can be carried out and the substrates can be aligned with respect to one another in dependence on the detection of the alignment marks, wherein at least two alignment marks are arranged flush with a linear movement of the substrates.

Preferably, it is provided that at least three alignment marks are arranged flush with the linear movement of the substrates.

Preferably, it is provided that at least one alignment mark is arranged at or on a substrate holder.

Preferably, it is provided that at least two alignment marks are arranged on a substrate and at least one alignment mark is arranged on the substrate holder, wherein the alignment marks are arranged flush with the linear movement of the substrates.

Preferably, it is provided that detection units for detecting the alignment marks are arranged in at least one annular measuring portal, preferably in at least one fully closed annular measuring portal.

Preferably, it is provided that detection units for detecting the alignment marks are arranged in two annular measuring portals, preferably in two fully closed annular measuring portals.

Preferably, it is provided that detection units for detecting the alignment marks are arranged in an annular measuring portal, preferably in a completely closed annular measuring portal, and in a C-shaped column.

Preferably, it is provided that the alignment takes place along a single alignment axis, wherein the alignment axis runs parallel to the loading and unloading direction of the substrates.

In other words, it is the core of the invention that at least two alignment marks are arranged flush with the linear movement of the substrates (i.e., at least two alignment marks are arranged parallel to the direction of the linear movement of the substrates). In this case, two alignment marks may for example be located on the substrate or for example, one alignment mark may be located on the substrate and another alignment mark may be located on the substrate holder. However, two or more alignment marks may for example be located on the substrate and/or on the substrate holder. These exemplary configurations apply both for the first/upper substrate or the first/upper substrate holder and for the second/lower substrate or the second/lower substrate holder. According to the invention, at least two alignment marks are arranged flush with the linear movement of the substrates. As a result, a high alignment accuracy is achievable owing to the reduction of transverse movements.

The invention is based in particular on the idea of increasing the alignment accuracy by means of an increased rigidity of the device with a portal design and/or by detecting at least three alignment markings (in the following also termed alignment marks), which are arranged flush with the linear movement of the substrates.

At least one alignment marking is preferably applied at or on a substrate holder. The position detection of the substrate holder delivers correction values for the location and the alignment state of the substrates to be aligned.

In an advantageous embodiment, at least one substrate holder has a preferably planar mounting surface for a substrate.

Furthermore, at least one substrate holder may in particular contain prismatic bodies which are monolithically joined to the mounting surface, which prismatic bodies can be called upon in the event of a known geometry as reference surfaces for optical position measurements in particular. These functional surfaces are constructed as laser reflectors, so that an accurate location of the body in space is to be determined due to the geometric shape and knowledge of the incidence points of the lasers. In this case, the position of the functional surfaces can be measured interferometrically and correspondingly corrected in a closed control loop.

A device according to the invention for aligning at least two substrates has at least one optical system, having two optical elements or detection units, which are aligned opposite one another in particular, the optical paths of which preferably meet at a common focal point. The common focal point constitutes a point of an idealized bonding plane of a first and a second substrate. The substrates are bonded to one another in this plane. The exact description and calibration of the focal points is described in detail in the published document WO2014202106.

According to an advantageous embodiment, the optical system or the detection units contain beam-shaping and/or deflection elements such as mirrors, lenses, prisms, radiation sources, particularly for Kohler illumination, and image acquisition means, such as cameras (CMOS sensors or CCDs, or surface or row or point detection means, such as a phototransistor) and movement means for focusing and analysis means for controlling the optical system.

A development according to the invention contains more than two identical optical systems with aligned optical elements.

Furthermore, the device according to the invention includes substrate holders for mounting the substrates to be aligned. An embodiment of the device according to the invention contains at least two movable substrate holders, which can mount and fasten a first substrate to be aligned and a second substrate to be aligned. Movement and positioning systems of the substrate holders are subsumed as movable substrate holders.

The substrates may have any desired shape, but are preferably circular. Wafers are always understood as substrates. The diameter of the substrates is in particular industrially standardized. For wafers, the industry-standard diameters are 1 inch, 2 inches, 3 inches, 4 inches, 5 inches, 6 inches, 8 inches, 12 inches and 18 inches or the corresponding metric conversions. The embodiment according to the invention may however fundamentally handle any substrate, independently of the diameter thereof.

According to the invention, it is conceivable, instead of a substrate, to use a substrate stack comprising at least two mutually joined substrates and join the substrate stack to a substrate or to another substrate stack. In the further disclosure, substrate stacks may be used and understood as subsumed under substrates.

Alignment of the substrates with respect to one another takes place in particular on the basis of alignment markings which are located on contact surfaces of the substrates. The alignment markings on opposite sides of the opposite substrates are complementary to one another in particular.

Alignment markings may be any objects, which can be aligned with respect to one another, such as crosses, squares or circles, and also propeller-like shapes or grid structures, particularly phase grids for the spatial frequency range.

The alignment markings are preferably detected by means of electromagnetic radiation of a certain wavelength or wavelength ranges, particularly infrared radiation, visible light or ultraviolet radiation. However, the use of radiation from different wavelength ranges is likewise possible.

Furthermore, the device according to the invention may contain a system for producing prebonds.

Furthermore, the device according to the invention preferably contains movement devices with drive systems, guide systems, fastenings and measurement systems, in order to be able to move, position and align the optical systems and the substrate holders and/or substrates with respect to one another. The movement devices can execute controlled positioning of the substrate holders, which are steered by open-loop and/or closed-loop control units, particularly computers and/or closed-loop control algorithms.

The movement devices can create any movement as a result of individual movements, so that the movement devices may preferably contain fast coarse positioning devices, which do not meet the accuracy requirements, and precisely operating fine positioning devices. A set-point value of the position to be travelled to is an ideal value. The movement device approaches the ideal value. Reaching a defined environment around the ideal value may be understood as achieving the set-point value.

A positioning device is understood as a coarse positioning device, if the positioning or repeat accuracy deviates from the set-point value by less than 0.1%, preferably less than 0.05%, particularly preferably less than 0.01%, with respect to the total travel path or rotational range, in the case of rotary drives capable of revolving, a full revolution of 360 degrees. For example, in the case of a coarse positioner (pre-aligner) with a travel path of more than 600 mm (double the substrate diameter), a positioning accuracy of 600 mm*0.01%, that is to say less than 60 micrometres therefore results as residual uncertainty. In other embodiments of the coarse positioning, the residual uncertainty of the positioning or repeat accuracy is less than 200 micrometres, preferably less than 150 micrometres, particularly preferably less than 50 micrometres. In this case, the thermal disturbance values should likewise also be taken into account.

A coarse positioning device only fulfils the positioning task with sufficient accuracy if the deviation between the actual position, actually reached, and the set-point value of the position lies in the travel range of an assigned fine positioning device.

An alternative coarse positioning device only fulfils the positioning task with sufficient accuracy if the deviation between the actual position, actually reached, and the set-point value of the position lies in half of the travel range of an assigned fine positioning device.

A positioning device is understood as a fine positioning device if the residual uncertainty of the positioning and/or repeat accuracy from the set-point value does not exceed less than 500 ppb, preferably less than 100 ppb, ideally 1 ppb with respect to the total travel path or rotational range. Preferably, a fine positioning device according to the invention will have an absolute positioning error smaller than 5 micrometres, preferably smaller than 1 micrometre, particularly preferably smaller than 100 nm, very particularly preferably smaller than 10 nm, in the optimum case smaller than 5 nm, in the ideal case smaller than 1 nm.

The alignment and possibly (fusion bonding) takes place by means of finest drives, such as piezoelectric drives.

The device according to the invention and associated methods preferably have at least two positioning devices of highest accuracy and reproducibility. A concept of mutual error corrections may be used for the quality of the alignment of the substrates. Thus, a known offset (twisting and/or displacement) of a substrate and, correspondingly, the positioning device can be compensated using the adjustment and correction of the position of the other positioning device and the other substrate with correction values or correction vectors. In this case, how the open-loop control or closed-loop control uses the coarse and fine positioning or only the coarse or fine positioning for error correction is a question of the size and type of twisting and/or displacement. In the rest of the text, positioning devices (coarse or fine or composite positioning devices) and alignment means are considered as synonyms when used.

According to the invention, the alignment of the substrates with respect to one another can take place in all six degrees of freedom of movement: three translations according to the Cartesian coordinate directions x, y and z and three rotations about these coordinate directions. X, y and z direction or x, y and z position are understood as meaning directions running or positions arranged in the Cartesian x-y-z coordinate system. The x and y directions correspond in particular to the lateral direction of the substrate.

Position features are derived/calculated from the position and/or location values of the alignment markings of the substrates and from alignment markings on the substrate holder. According to the invention, the movements can be carried out in any direction and orientation. The alignment of the substrates contains a passive or active wedge error compensation in particular, preferably according to the disclosure in the published document EP2612109B1.

The method according to the invention increases the alignment accuracy in particular by means of additional X-Y position and/or location information, which is detected using additionally attached detection units and/or measuring and closed-loop control systems and used for open-loop/closed-loop control of the alignment. The additionally attached detection units and/or measuring and closed-loop control systems may be further optical-element groups having two mutually opposite optical elements in each case.

In a preferred embodiment, an additional (in particular third) alignment marking is applied to the substrate holder. This additional position feature is detected with at least one additional measurement system with a novel, additional optical path. The alignment markings on the substrate holders are likewise arranged flush with the linear movement of the substrates. The position detection of the substrate holders delivers correction values for the location and the alignment state of the substrates to be aligned. The alignment accuracy is increased due to the additional measured vales and correlations with at least one of the measured vales of the other detection units. Due to the correlation of at least one of the measured alignment markings, in the bond interface between the contact surfaces, with an alignment marking on the substrate holder, also visible during the alignment of the substrates, the direct observability of an alignment mark and thus a real-time measurement and closed-loop control is enabled during the alignment.

In a preferred embodiment, the additional measurement system is a laser interferometer. A laser interferometer enables a check of the linear movement of the substrate holders by means of the measurement of the position change (measurement of displacement), the tipping angle change (angular measurement), the flatness (measurement of the displacement and angle), the orthogonality (angular measurement) and, if required, the dynamics (measurement of the speed). In particular, the measurement of the tipping angle change enables the detection of the tipping of carriages on a linear bearing. The measurement of the straightness allows the detection or the precise detection of horizontal or vertical deviations of the slideway on linear bearings. For highly precise laser-interferometric measurements, a real-time correction of the laser wavelength is necessary, depending on the medium. In this case, e.g. pressure, material temperature and/or gas temperature (if present) must be detected.

A particularly preferred embodiment has at least one laser interferometer per substrate holder and/or substrate, preferably two laser interferometers per substrate holder and/or substrate, which detects the X-Y position and/or alignment location and/or angular position of both substrate holders and/or the substrates in relation to a defined reference, particularly to the frame. Preferably, the at least one interferometer is fixed to the frame.

Robots for substrate handling are subsumed under movement devices. The fastenings may be component- and/or function-integrated in the movement devices. Furthermore, devices according to the invention preferably contain closed-loop control systems and/or analysis systems, particularly computers, in order to execute the described steps, particularly movement sequences, carry out corrections, analyse and save operating states of the respective device according to the invention. Methods are preferably created as recipes and executed in machine-readable form. Recipes are optimized value collections of parameters, which exist in the functional or procedural context. The use of recipes makes it possible to ensure a reproducibility of production procedures.

Furthermore, according to a preferred embodiment, the device according to the invention contains supply and auxiliary and/or supplementary systems, such as e.g. compressed air, vacuum, electrical energy, liquids such as hydraulic fluid, coolant, heating medium, means and/or devices for temperature stabilization, electromagnetic shields.

Furthermore, the device according to the invention preferably contains frames, coverings, vibration-suppressing or -damping or -absorbing active or passive subsystems.

In a preferred embodiment of the device, the detection units, preferably together with their movement units, can be arranged in at least one annular measuring portal, particularly preferably in at least one fully closed annular measuring portal, particularly fixed to the frame.

The preferred embodiment of the device with a single portal is termed the monoportal design in the remaining text. The monoportal allows passing through the substrates together with substrate holders, so that a detection of the alignment marks at least of the substrates is enabled. In continuation, the positions of the substrate holders can likewise also be detected.

A core idea of the invention in particular is achieving a reduction of the alignment to only a single alignment axis whilst increasing the alignment accuracy for aligning at least two substrates. The layout of the device in a closed design increases the rigidity of the device, minimizes the vibration capacity and enables a detection of at least two, more preferably three alignment marks, which are arranged flush with the linear movement of the substrates.

As the alignment axis in particular coincides with the loading and unloading direction, additional movements transverse to the loading and unloading direction are dispensed with. Due to the combination and correlation with directly detectable alignment markings on the substrate holder, the alignment accuracy is additionally improved.

In a preferred embodiment of the device, at least two detection units can be arranged in a main longitudinal axis of the device. In a further preferred embodiment of the invention, the at least two detection units may be arranged as an upper and a lower detection unit with preferably common focal point.

In a preferred embodiment of the device, the upper and lower detection units with independent movement units may be joined to a frame or to the portal in such a manner that, in particular, focusing and calibration methods can be executed, using which a common focal point in particular may be readjusted.

In a preferred embodiment of the device, the movement units of the detection units may be moved in a global, particularly frame-fixed, coordinate system in the main coordinate directions x, y, z. The travel paths of the movement units of the detection units in the plane of the substrates, that is to say in the x and y directions, are less than 20 mm, preferably less than 10 mm, particularly preferably less than 5 mm.

In a preferred embodiment, the movement units of the detection units, may be moved, particularly in the z direction, by more than 5 mm, preferably more than 10 mm, particularly more than 20 mm, so that focusing of non-standardized substrate stacks can likewise be enabled.

In an alternative embodiment, the height of the substrates can be compensated by the positioning of the substrate holders in such a manner that focusing paths of smaller than 1 mm, preferably smaller than 0.5 mm are used.

In a preferred embodiment of the device, the movement units of the detection units can in particular be designed as play-free solid-state joints or guides.

In a different embodiment, further detection means of all types may be attached in the portal, particularly fixed to the frame.

Furthermore, the device according to the invention contains at least one measurement system, preferably with measuring units for each movement axis, which can be realized in particular as distance measurement systems and/or as angle measurement systems.

Both tactile, that is to say touch-based, or non-tactile measuring methods may be used. The measuring standard, the unit of measurement, may be present as a physical object, particularly as a scale, or be implicitly present in the measuring method, like the wavelength of the radiation used.

At least one measurement system can be selected and used for achieving the alignment accuracy. Measurement systems implement measuring methods. In particular
inductive methods, and/or
capacitive methods, and/or
resistive methods, and/or
comparison methods, particularly optical image recognition methods, and/or
incremental or absolute methods (particularly with glass standard as scale, or interferometers, particularly laser interferometers, or with magnetic standard), and/or
transit time methods (Doppler methods, time-of-flight methods) or other time detection methods, and/or
triangulation methods, particularly laser triangulation, and/or
autofocus methods, and/or
intensity measurement methods, such as fibre-optic range finders may be used.

Furthermore, a preferred embodiment contains at least one additional measurement system, which detects the X-Y position and/or alignment location and/or angular position of at least one of the substrates and/or one of the substrate holders in relation to a defined reference, particularly to the frame, preferably according to PCT/EP2016/070289.

A particularly preferred embodiment contains additional measurement systems for all substrate holders, which detect the X-Y position and/or alignment location and/or angular position of both substrate holders and/or the substrates in relation to a defined reference, particularly to the frame.

A part comprising in particular of natural hard stone or a mineral cast or nodular graphite cast iron or hydraulically bound concrete, which is erected in particular in an actively or passively vibration-damped and/or vibration-isolated manner and/or with vibration absorption, can be understood as a frame. The frame may contain further holding and/or guide functionalities. In particular, lines for compressed air may be accommodated in the interior of the frame in the frame volume. Furthermore, electrical lines and connections may be accommodated in the frame volume. Furthermore, fastening elements and/or anchoring points for superstructures can be joined in the frame, particularly in a positive-fitting and/or materially-bonded manner.

The frame may, in particularly preferred embodiments, be produced in a primary forming method, particularly filling a negative mould. In particularly preferred embodiments, the frame may have cores during filling.

In particularly preferred embodiments, the frame may contain a flatness standard. In particularly preferred embodiment of the frame, a flatness standard may be moulded, so that the flatness standard can be replicated several times.

According to the invention, measured vales may in particular be combined with one another and/or referenced to one another and/or correlated, so that by means of a measurement of an alignment marking, it is possible to draw a conclusion about the position of the respectively other alignment marking.

According to the invention, measured vales may be correlated with one another, so that in each case, the relative positions of the alignment marks with respect to one another are present as values, which allow a reference to the frame.

In a preferred embodiment according to the invention, the position of the substrate holder during passage of the portal along the three coordinate axes is measured, particularly continuously, so that the real guide path of the substrate is detected. The real guide path is taken into account as a correction factor in calculations for the alignment position of the substrates with respect to one another.

In another preferred embodiment according to the invention, the position of a substrate holder is detected at a point (or place or measuring dot or field of view) in relation to the reference, particularly the first alignment marking on the first substrate and/or the second alignment marking on the second substrate.

In another preferred embodiment according to the invention, the position of a substrate holder is detected at exactly two points in relation to the reference.

In a further embodiment according to the invention, the position of a substrate holder is detected at exactly three points in relation to the reference and the position and location of the substrate holder is determined therewith.

For a position determination at one point or at two points or three points or any desired number of points, optical pattern recognition by means of camera systems and patterns applied on the substrate holder may preferably be used. The patterns are detected in a real-time system, particularly continuously during alignment.

In another preferred embodiment, the position determination of the substrate holders can take place by means of laser interferometers. Laser interferometry enables an extremely exact contactless length measurement by means of interferences. A laser interferometer enables the checking of the linear movement of the substrate holders by means of the measurement of the position change (measurement of displacement), the tipping angle change (angular measurement), the flatness (measurement of the displacement and angle), the orthogonality (angular measurement) and the dynamics (measurement of the speed in the case of multiple-beam interferometers).

In particular, the measurement of the tipping angle change enables the detection of a tipping of carriages on a linear bearing. The measurement of the straightness allows the detection or the precise detection of horizontal or vertical deviations of the slideway on linear bearings.

Thus, the relative movements of the subsystems (fastening of the respective interferometer to the frame and measured object, particularly substrate holder) can be determined. For displacement measurements, e.g. dual frequency laser methods may be used. In this case, measurement resolutions of down to 5 nm, more preferably of down to 1 nm (due to the use of multiple reflection) can be achieved at a maximum travel speed of up to 1 m/s. Dual frequency lasers are likewise used for angular measurement.

A further possibility is created by the use of a plurality of parallel integrated single frequency laser interferometers. Here, the displacements are determined at a plurality of points of the substrate holder. In this case, measurement resolutions of down to 0.1 nm can be achieved. The angular change can be determined from the spacing of the measuring beams from one another and the differences of the displacements that occur.

If interferometers with three measuring beams are used (three beam interferometers), the angular position of the substrate holder and the displacement thereof is determined in two axes. In a preferred embodiment of the device according to the invention, a three beam interferometer is used.

An additional angular measurement for determining the position of the substrate holders may take place, if required, using an autocollimator.

If combined measurement systems are used, measured values of an absolute and incremental displacement sensor can be correlated with the measured values of at least one interferometer and used in a supplementary manner to one another. Thus, the accuracy of an absolute positioning can be increased.

The listed measuring methods can likewise be used for the position determination.

A reversal is also conceivable according to the invention, particularly by attaching the detection units on the substrate holder and attaching alignment markings on the frame.

So that detection, analysis and open-loop control (and/or closed-loop control) can take place at any desired point in time, particularly permanently, open-loop control unit and/or closed-loop control unit are supplied with measured values, particularly continuously (and/or digitally in a time-discrete manner with a sufficiently high clock frequency).

For example, an alignment mark on the substrate may be detected by means of optical image recognition and/or pattern recognition. In particular, at the same time, the location and/or the alignment state of the associated substrate holder and all relevant closed-loop control parameters can be detected and saved in a matrix and further processed.

In a preferred embodiment of the device, the position of the substrate holder can be measured with at least one interferometer beam, preferably with at least two interferometer beams, in the optimum case with at least three interferometer beams. At the same time, position values of the substrate holder can be measured by incremental encoders. These are referenced and measure the growth of the path starting from a given position. Due to the combination of the relative values of the interferometers and the readings of the incremental displacement sensor, position values up to the frame may be referenced as the neutral plane and/or neutral position.

For x-y position determination at least at one point, in another embodiment according to the invention, at least one interferometer may be used with a correspondingly constructed, particularly monolithic, reflector for the detection of the x-y position and/or location determination of the substrate holder. Three interferometer beams can be used to this end.

The number of interferometer beams may in particular be equal to the number of reflection surfaces of the reflector. According to the invention, it is however also conceivable that an extended reflection surface, particularly a monolithic optical mirror, is used as reflector by a plurality of interferometer beams.

The substrate holder, which is formed from a monolithic block in particular, preferably has at least two of the following functions:
  substrate fastening by means of a vacuum (vacuum tracks, connections),
    shape compensation for deforming the substrate by means of mechanical and/or hydraulic and/or piezo-electronic and/or pyroelectric and/or electrothermal actuating elements, preferably according to the embodiments of EP2656378B1, WO2014191033A1 and WO2019057286A1.
    position and/or location determination (measuring standards, reflection surfaces and/or prisms, particularly the reflectors for the interferometry, registration marks and/or registration mark fields, measuring standards constructed in a planar manner for planes, volume standards, particularly levels).
  movement (guide paths).

Movement devices according to the invention, which are not only used for fine adjustment, are particularly constructed as robot systems, preferably with incremental displacement sensors. The accuracy of these movement devices for auxiliary movements is decoupled from the accuracy for aligning the substrate stack, so that the auxiliary movements are executed with low repeat accuracy of smaller than 1 mm, preferably smaller than 500 micrometres, particularly preferably smaller than 150 micrometres.

The open-loop and/or closed-loop control of movement devices according to the invention for (lateral) alignment (fine adjustment) is carried out in particular on the basis of x-y positions and/or alignment locations detected using other measuring means. The accuracy of these movement devices is preferably smaller than 200 nm, further preferably smaller than 100 nm, particularly preferably smaller than 50 nm, very particularly preferably smaller than 20 nm, further preferably smaller than 10 nm, in the ideal case smaller than 1 nm.

Installation with Two Measuring Portals

In another embodiment according to the invention, the detection units, particularly together with the movement units thereof, are integrated into two fully closed portals, which are in particular connected to one another in a rigid, torsion-resistant manner.

Here also, the embodiment particularly uses a clear optical path from the light source to the alignment mark for detecting the alignment marks, analogously to WO2014202106A1.

The device has two portals which are rigidly connected to one another at a spacing from one another greater than one substrate diameter. Analogously to the embodiment of U.S. Pat. No. 6,214,692B1, which is termed the SmartView Aligner (SVA) in the following, at least two optical detection means, placed opposite one another and with a common focal plane, are arranged in the portal in an adjustable manner.

A first, closed portal with detection means is positioned at the end of the travel path, which detects alignment marks one after the other at the edge of the substrates. To this end, the substrates are loaded on the substrate holder, rotated through 90 degrees compared to the SVA, so that the alignment marks are arranged one behind the other, flush with the linear movement.

The upper and lower substrate holders in each case continue from the coverage position of the substrates to reach the detection means and expose the edge with the alignment marks.

A second, closed portal allows traversing the respective substrate holder, like the loading or unloading movement.

Here, the substrates are likewise moved in the single alignment axis, in order to bring the alignment marks into the optical path of the second portal.

Alignment of the substrates with respect to one another takes place in particular indirectly on the basis of alignment markings which are located on contact surfaces of the substrates. The alignment markings on opposite sides of the opposite substrates are complementary to one another in particular.

In this embodiment also, the alignment accuracy can be increased, in that in addition, a detection of an additional, in particular third, alignment marking is undertaken, which is either applied to one of the substrates to be aligned or to the substrate holder.

The additional alignment marking is preferably applied to the substrate holder. The position detection of the substrate holders delivers correction values for the location and the alignment state of the substrates to be aligned. The alignment accuracy is increased due to the additional measured vales and correlations with at least one of the measured vales of the other detection units. Due to the correlation of at least one of the measured alignment markings, in the bond interface between the contact surfaces, with an alignment marking on the substrate holder, also visible during the alignment of the substrates, the direct observability of an alignment mark and thus a real-time measurement and closed-loop control is enabled during the alignment. In a preferred embodiment, the additional measurement system is a laser interferometer, preferably a three beam interferometer.

In a preferred embodiment, further detection means are attached in the portals, fixed to the frame in particular. The method detailed above for the device applies for the embodiment:

Installation with Monoportal and Column

Another device according to the invention has a monoportal, as described previously, and a column (C design), which are in particular rigidly connected to one another at a spacing greater than one substrate diameter.

The detection units are integrated in the portal and in the column here.

Here also, the embodiment particularly uses a clear optical path from the light source to the alignment mark for detecting the alignment marks, analogously to WO2014202106A1.

A column with detection means is preferably positioned at the end of the travel path, which detects alignment marks one after the other at the edge of the substrates. To this end, the substrates are loaded on the substrate holder, rotated through 90 degrees compared to the SVA, so that the alignment marks are arranged one behind the other, flush with the linear movement.

The upper and lower substrate holders in each case continue from the coverage position of the substrates to reach the detection means and expose the edge with the alignment marks.

The monoportal, as described previously, makes it possible to traverse the respective substrate holder like the loading or unloading movement.

Here, the substrates are likewise moved in the single alignment axis, in order to bring the alignment marks into the optical path of the monoportal and the column.

Alignment of the substrates with respect to one another takes place in particular indirectly on the basis of alignment markings which are located on contact surfaces of the substrates. The alignment markings on opposite sides of the opposite substrates are complementary to one another in particular.

In this embodiment also, the alignment accuracy can be increased, in that in addition, a detection of an additional, in particular third, alignment marking is undertaken, which is either applied to one of the substrates to be aligned or to the substrate holder.

The additional alignment marking is preferably applied to the substrate holder. The position detection of the substrate holders delivers correction values for the location and the alignment state of the substrates to be aligned. The alignment accuracy is increased due to the additional measured vales and correlations with at least one of the measured vales of the other detection units. Due to the correlation of at least one of the measured alignment markings, in the bond interface between the contact surfaces, with an alignment marking on the substrate holder, also visible during the alignment of the substrates, the direct observability of an alignment mark and thus a real-time measurement and closed-loop control is enabled during the alignment. In a preferred embodiment, the additional measurement system is a laser interferometer, preferably a three beam interferometer.

In a preferred embodiment, further detection means are attached in the monoportal and in the column, fixed to the frame in particular. The method detailed above for the device applies for the embodiment:

Method

An exemplary embodiment of the method according to the invention is explained by means of the monoportal embodiment of the device. In this case, the substrates are loaded one after the other and pushed with the substrate holder through the portal in a scanning movement, so that the positions of the respective alignment marks and the references on the substrate holders are detected in a correlated manner.

An image to image alignment is carried out on the basis of the alignment marks of the substrates. The alignment accuracy is additionally checked, in that the position of the substrate holders gives information about the position of the substrates by means of the additional alignment marks and the actual position of the substrate holders is taken into account by means of correction factors.

A repeated embodiment of the method according to the invention comprises the following particularly at least partially sequential and/or simultaneous steps, particularly the following procedure:

1) A contact surface of the first/lower substrate is loaded onto the first/lower substrate holder, wherein alignment marks are arranged on the opposite side (contact side) parallel to straight-line guidance, i.e. flush with the linear movement of the substrates.
2) The first/lower substrate is moved with the substrate holder into the field of view of a detection position of a first/upper detection unit of the optical system on the monoportal, particularly using movement devices for coarse adjustment.
3) In particular, the first/lower substrate holder is measured during the entire travel path, particularly by means of three beam interferometers. Displacement and angle give information inter alia about position and tipping of the substrate holder on the linear bearing.
4) Detection of the first alignment marking, particularly by means of pattern recognition.
5) At the same time, particularly by means of synchronization with the first detection unit, the X-Y position and/or alignment location of the first substrate holder is detected by means of an additional measurement system according to the invention (with third detection unit). Displacement and angle give information inter alia about location (position) and angle (tipping, i.e. pitch and yaw angle) of the substrate holder on the linear bearing.
6) Detection of the second alignment marking, particularly by means of pattern recognition.
7) At the same time, particularly by means of synchronization with the first detection unit, the X-Y position and pitch and yaw angle and/or alignment location of the first substrate holder is detected by means of an additional measurement system according to the invention, particularly a three beam interferometer (with third detection unit).
8) The first/lower substrate holder is moved out of the field of view (beam path for detection) of the optical system.
9) The second/upper substrate is loaded onto the second/upper substrate holder. This method step may already be carried out prior to one of the previous method steps.
10) The second/upper substrate holder travels with the second/upper substrate to the monoportal and into the field of view of the optical system.
11) In particular, the second/upper substrate holder is measured during the entire travel path by means of three beam interferometers. Displacement and angle give information inter alia about position and tipping of the substrate holder on the linear bearing.
12) The second/lower detection unit of the optical system seeks and detects the alignment marking on the second/upper substrate. In this case, the optical system is not moved mechanically, however a correction of the focusing is conceivable. Preferably however, no focusing movement is carried out.
13) At the same time, particularly by means of synchronization with the second detection unit, the X-Y position and pitch and yaw angle and/or alignment location of the second substrate holder is detected by means of an additional measurement system according to the invention, particularly a three beam interferometer (with third detection unit).
14) Detection of the second alignment marking, particularly by means of pattern recognition.
15) At the same time, particularly by means of synchronization with the second detection unit, the X-Y position and pitch and yaw angle and/or alignment location of the second substrate holder is detected by means of an additional measurement system according to the invention, particularly a three beam interferometer (with third detection unit).
16) The control and analysis computer determines the alignment errors, wherein reference is made to the disclosures in the published documents U.S. Pat. No. 6,214,692B1 (Smart View) and U.S. Pat. No. 9,418,882B2 (Enhanced Smart View). An alignment error vector in particular is created from the alignment error. Subsequently, at least one correction vector in particular is calculated. The correction vector may be a vector parallel and opposite to the alignment error vector, so that the sum of the alignment error vector and the correction vector gives zero. In special cases, further parameters may be taken into account in the calculation of the correction vector, so that the result is different from zero.
17) Alignment by means of fine positioning
18) Corrections for displacements/twisting
19) Optional method step: The substrates are bonded. The bonding may also be a prebond or temporary bond. Prebonding designates bonding joins, which still permit a separation of the substrates, particularly the wafers, without irreparable damage to the surfaces, after the prebonding step has taken place.
20) The substrate stack is unloaded from the device.

The loading sequence of the substrates may be arbitrary. Some method steps, such as the loading of the substrates, may be carried out simultaneously. The additional measurement systems can detect the position and/or location both of the upper and the lower substrate holder and/or the upper and the lower substrate.

The device according to the invention can also be operated in a vacuum. Thus, it is possible to use the device in a vacuum cluster or high vacuum cluster.

All of the technically possible combinations and/or permutations and multiplications of the functional and/or material parts of the device and the associated changes in at least one of the method steps or methods are considered to be disclosed.

Insofar as device features are disclosed in the present text and/or in the attached description of the figures, these should also be considered as disclosed as method features, and vice versa.

Further advantages, features and details of the invention result from the following description of preferred exemplary embodiments, as well as on the basis of the drawings.

BRIEF DESCRIPTION OF DRAWINGS

In the figures, the same components or components with the same function are labelled with the same reference numbers.

In FIGS. 1 to 4, the ratios of the individual components are disproportionate. The features according to the invention are not illustrated to scale in FIGS. 1 to 4, in order to be able to illustrate the function of the individual features better.

DETAILED DESCRIPTION OF INVENTION

Figure 1:
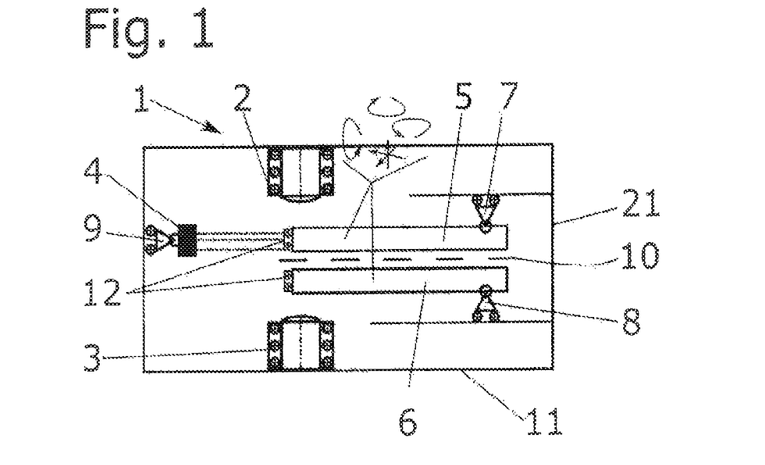
FIG. 1 shows a schematic cross-sectional illustration of a first embodiment of the device according to the invention.
Figure 2:
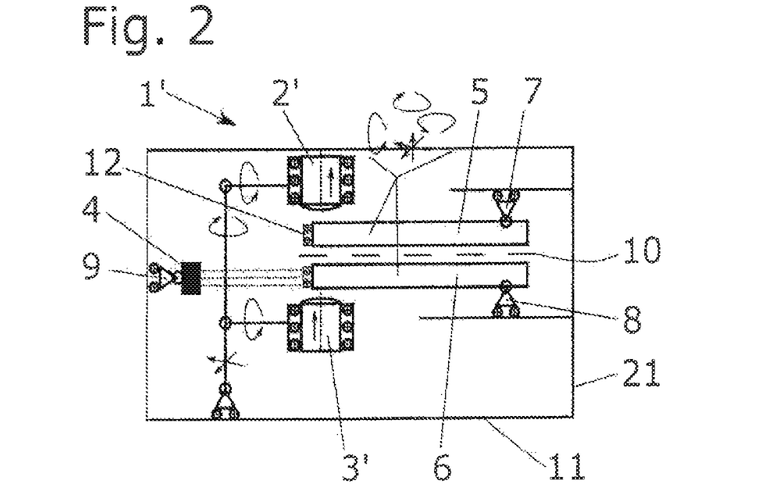
FIG. 2 shows a schematic cross-sectional illustration of a second embodiment of the device according to the invention.

FIGS. 1 and 2 show schematic cross sections of two embodiments of the devices 1, 1' according to the invention. These have:
- a first/upper detection unit 2, 2' in the form of a first/upper optical element,
- a second/lower detection unit 3, 3' in the form of a second/lower optical element,
- a third detection unit 4 in the form of a three beam interferometer,
- a first/lower mount in the form of a substrate holder 6 or with a lower substrate holder 6,
- a second/upper mount in the form of a substrate holder 5 or with an upper substrate holder 5,
- a first/lower movement device 8 for the first/lower substrate holder 6,
- a second/upper movement device 7 for the second/upper substrate holder 5, and
- a third movement device 9 for the third detection unit 4.

The device 1, 1' according to FIGS. 1 and 2 is able to align the substrates 14 (first/lower substrate) and 20 (second/upper substrate), not illustrated in FIGS. 1 and 2, and/or substrate stacks with respect to one another and join the same to one another. This join may also be a temporary join (what is known as a prebond).

Possible movements/degrees of freedom of the functional components in FIGS. 1 to 4 described in the following are to some extent also illustrated symbolically as arrows. For the first/lower mount 6 and for the second/upper mount 5 according to FIGS. 1 and 2, at least one Y translation unit, one X translation unit, one Z translation unit and one phi rotation unit are possible.

A phi rotation unit allows a rotation of the loaded substrate 14, 20 about the surface normal thereof. The resolution of the reproducible positioning capability of all of the rotation units used is in particular better than 1°, with preference better than 0.1°, with greater preference better than 0.01°, with greatest preference better than 0.001° and most preferably better than 0.0001°.

The resolution of the reproducible positioning capability of all of the translation units used is in particular better than 100 μm, with preference better than 10 μm, with greater preference better than 1 μm, with greatest preference better than 100 nm and most preferably better than 1 nm.

In the embodiment according to FIG. 1, the first and second detection units 2, 3 are not able to move in all three spatial directions X, Y and Z. The detection units 2, 3 are installed statically in the measuring portal 21.

In the embodiment according to FIG. 2, the first and second detection units 2', 3' are able to move in all three spatial directions. In another embodiment, rotation units may also be installed, which allows a rotation of the optical axis about three mutually orthogonal axes.

The first and second detection units 2, 2', 3, 3' according to FIGS. 1 and 2 can detect a focal plane 10 in the opposite direction. The common focal point 10p according to FIG. 4 constitutes a point of an idealized bonding plane of a first and a second substrate.

The device 1, 1' according to FIGS. 1 and 2 provides means for the additional detection of the movement of the substrates, particularly by means of length measurements, pitch angle measurements and yaw angle measurements and straightness measurements by means of an additional third measuring device 4, which refer to at least one fixed, particularly stationary, reference point or a reference and thus enable the determination of a correction factor.

In a preferred embodiment, the additional detection of the movement of the substrates 14, 20 is carried out using a three beam interferometer or a calibrating laser interferometer 4. The measurement system 4 uses a novel, additional optical path. For that, in a preferred embodiment, an additional (in particular third) alignment marking 12 is preferably applied to the substrate holder 5, 6. Using the interferometer 4, a simultaneous length measurement and pitch and yaw angle detection 17 is carried out according to FIGS. 3a and 3b.

In another preferred embodiment, the additional third measuring device 4, particularly a laser interferometer, is stationary or fixed to the frame.

In another preferred embodiment of the device, the position of the substrate holder and/or the substrate can be measured using at least one laser interferometer fixed to the frame, preferably using two laser interferometers fixed to the frame.

The position detection of the substrate holders 5, 6 delivers correction values for the location and the alignment state of the substrates 14, 20 to be aligned. The alignment accuracy is increased due to the additional measured vales and correlations with at least one of the measured vales of the other detection units 2, 2', 3, 3'. Due to the correlation of at least one of the measured alignment markings 15, 16 according to FIGS. 3a and 3b, in the bond interface between the contact surfaces, with an alignment marking 12 on the substrate holder 5, 6, also visible during the alignment of the substrates, the direct observability of the alignment mark 12 and thus a real-time measurement and closed-loop control is enabled during the alignment.

Figure 3A:
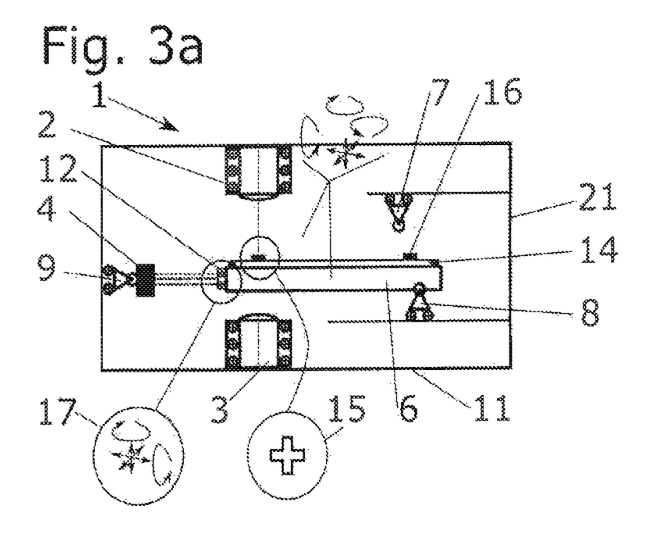
FIG. 3a shows a schematic, enlarged cross-sectional illustration of the first embodiment according to FIG. 1 in a first method step.

In a first process step according to the invention, according to FIG. 3a, the first/lower substrate holder 6 or the first/lower movement device 8 travels along a linear guide 18b (according to FIG. 4) for the first/lower movement device, until the left or first alignment marking 15 of the first/lower substrate is located in the viewing area of the upper measuring device 2 or optical element.

The movements of the translation units and rotation units are detectable and the detection data are transmitted to the central control unit for further processing and control.

Figure 3B:
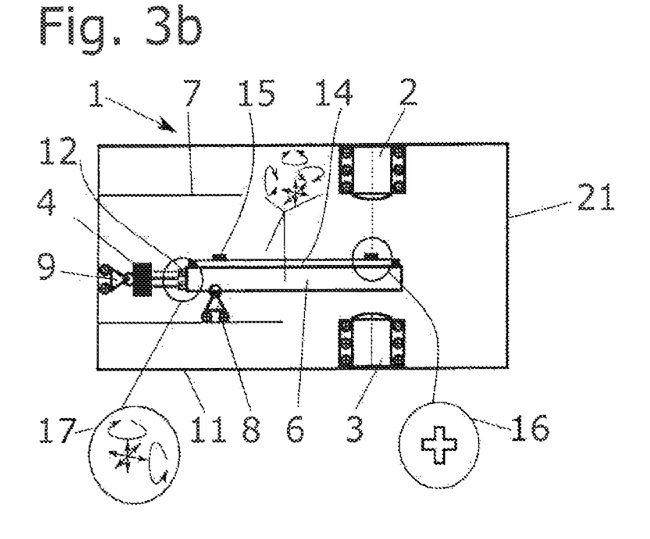
FIG. 3b shows a schematic, enlarged cross-sectional illustration of the first embodiment according to FIG. 1 in a second method step.

In a second process step according to the invention, according to FIG. 3b, the first/lower substrate holder 6 or the first/lower movement device 8 travels further along the linear guide 18b (see FIG. 4) for the first/lower movement device 8, until the right or second alignment marking 16 of the first/lower substrate 14 is located in the viewing area of the upper measuring device 2, i.e. the upper optical element.

In a third process step according to the invention, which is not illustrated, the second/upper substrate holder 5 or the second/upper movement device 7 travels along a linear guide 18a (according to FIG. 4) for the second/upper movement device 7, until the left or first alignment marking of the second/upper substrate 20 is located in the viewing area of the lower measuring device 3, i.e. the lower optical element.

In a fourth process step according to the invention, which is not illustrated, the second/upper substrate holder 5 or the second/upper movement device 7 travels further along the linear guide 18a (see FIG. 4) for the second/upper movement device 7, until the right or second alignment marking of the second/upper substrate 20 is located in the viewing area of the lower measuring device 3, i.e. the lower optical element.

According to the invention, the optical element is in particular controlled in such a manner that the position of the alignment marking in relation to the optical axis can be recognized, detected and saved by means of the optical element.

The layout of the device in a closed design increases the rigidity of the device 1, 1' and minimizes the vibration capacity. It is sufficient to align a guide direction for the substrate holders 5, 6 with respect to one another as accurately as possible. In this case, a three beam interferometer 4 enables the checking of the linear movement of the substrate holders 5, 6 by means of the measurement of the position change (measurement of displacement), the tipping angle change (angular measurement), the flatness (measurement of the displacement and angle), the orthogonality (angular measurement) and the dynamics (measurement of the speed).

In particular, the measurement of the tipping angle change enables the detection of a tipping of carriages on a linear bearing. The measurement of the straightness allows the detection or the precise detection of horizontal or vertical deviations of the slideway on linear bearings. Position features are derived or calculated from the position and/or location values of the alignment markings 15, 16 of the substrates 14, 20 and from alignment markings 12 on the substrate holder 5, 6.

The correlation of at least one of the measured alignment markings 15, 16 according to FIGS. 3a and 3b, in the bond interface between the contact surfaces, with an alignment marking 12 on the substrate holder 5, 6, also visible during the alignment of the substrates 14, 20, enables a continuous, direct correlation of the position data and thus the real-time measurement and closed-loop control during the alignment. The position correction increases the accuracy compared to conventional installations.

The open-loop and/or closed-loop control of the movement devices for (lateral) alignment (fine adjustment) is carried out in particular on the basis of X-Y positions and/or alignment locations detected using other measuring means. The accuracy of these movement devices is preferably smaller than 200 nm, preferably smaller than 100 nm, particularly preferably smaller than 50 nm, very particularly preferably smaller than 20 nm, further preferably smaller than 10 nm, in the ideal case smaller than 1 nm.

After determining all necessary parameters, an alignment of the two substrates 14, 20 takes place in a last step.

Alignment of the substrates 14, 20 with respect to one another takes place in particular indirectly on the basis of alignment markings 15, 16 which are located on contact surfaces of the substrates 14, 20.

The substrate holders 5, 6 are moved in position- and in particular location-controlled form by means of the movement devices 7, 8 until the alignment error, which is calculated from the position value of the detection units (optical elements) and the current position and/or location of the substrate holder 5, 6 (three beam interferometer), is minimized or, in the ideal case, eliminated. Alternatively, an abort criterion is defined.

Then, finally, the contacting of both substrates 14, 20 takes place, preferably exclusively by means of a movement of the Z translation unit(s) of the substrate mounts 5, 6.

In a particular embodiment, the device 1, 1' may be located in a vacuum chamber or a housing. The device 1, 1' may also be part of a cluster.

Figure 4:
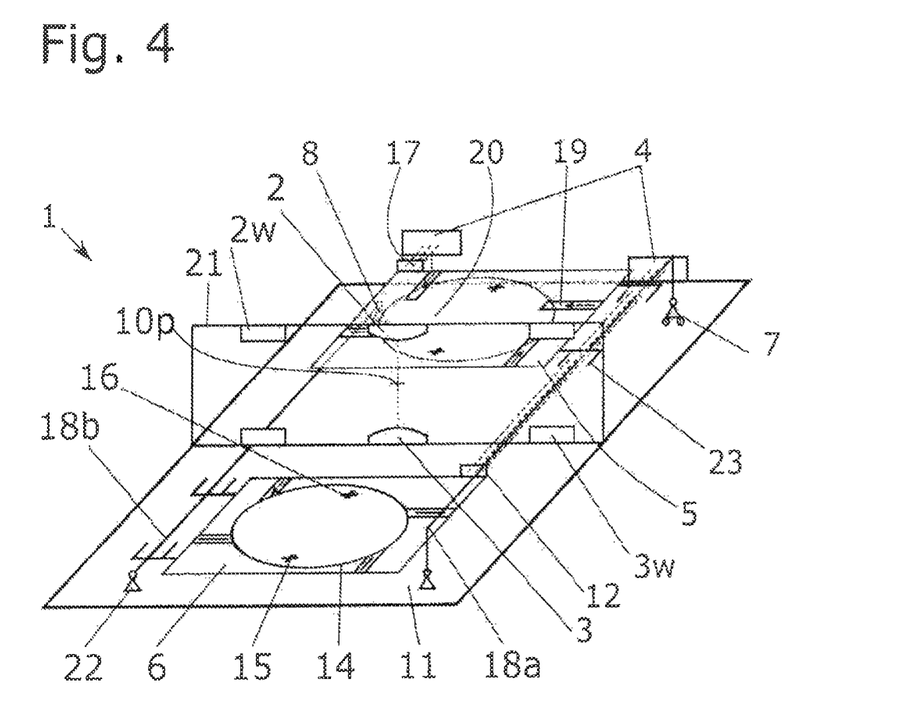
FIG. 4 shows a schematic, perspective view of an exemplary embodiment of the device according to the invention.

FIG. 4 shows a schematic, perspective view of the embodiment 4. The first/upper detection unit 2 and, if required, further upper detection units and/or sensors and/or measuring units 2w are integrated in a monoportal 21. Analogously, the second/lower detection unit 3 and, if required, further lower detection units and/or sensors and/or measuring units 3w are also integrated in the monoportal 21 or in the frame 11.

The embodiment according to FIG. 4 furthermore has:
- a plurality of detection units 4 (fixed to the frame) in the form of a three beam interferometer in each case for the lower and the upper substrate holder 5, 6,
- a first/lower mount in the form of a substrate holder 6 or with a lower substrate holder 6, for the, in particular statically fixed, mounting of the first/lower substrate 14 on a mounting side facing away from the side to be bonded,
- a second/upper mount in the form of a substrate holder 5 or with an upper substrate holder 5, for the, in particular statically fixed, mounting of the second/upper substrate 20 on a mounting side facing away from the side to be bonded,
- a first/lower movement device 8 for the first/lower substrate holder 6,
- a second/upper movement device 7 for the second/upper substrate holder 5.

FIG. 4 shows the linear guide 18a for the second/upper movement device and the linear guide 18b for the first/lower movement device with fixed bearing 22 and guide elements 23.

The first alignment marking 15 and the second alignment marking 16 of the first/lower substrate 14 are aligned essentially parallel to the main loading direction of the substrates 14, 20. This direction is given by the linear guides 18a and 18b. Fine drives 19 for correction movements about all three spatial axes are available for the substrates 14, 20.

REFERENCE LIST 1, 1' Device
2, 2' First/upper detection unit
2w Further upper detection units and/or sensors and/or measuring units
3, 3' Second/lower detection unit
3w Further lower detection units and/or sensors and/or measuring units
4 Third detection unit
5 Second/upper substrate holder
6 First/lower substrate holder
7 Second/upper movement device for substrate holders
8 First/lower movement device for third detection unit
9 Third movement device for third detection unit
10 Theoretical focal plane
10p Theoretical focal point
11 Frame 12 Third alignment marking
14 First/lower substrate
15 First alignment marking of the first/lower substrate
16 Second alignment marking of the first/lower substrate
17 Simultaneous length measurement and pitch and yaw angle detection by means of three beam interferometer
18a Linear guide for the second/upper movement device
18b Linear guide for the first/lower movement device
19 Fine drives
20 Second/upper substrate
21 Monoportal
22 Fixed bearing
23 Guide elements

What is claimed is:

1. A method for aligning first and second substrates, the method comprising:
   detecting alignment marks on the first and second substrates; and
   aligning the first and second substrates with respect to one another in dependence on detection of the alignment marks,
   wherein at least two alignment marks are arranged parallel to a direction of a linear movement of the first and second substrates,
   wherein alignment of the first and second substrates takes place along a single alignment axis,
   wherein the alignment axis runs parallel to a loading and an unloading direction of the first and second substrates, and
   wherein the detecting of the alignment marks on the first and second substrate is performed along the alignment axis in alignment with the loading and the unloading direction of the first and second substrates.

2. The method according to claim 1, wherein at least three alignment marks are arranged parallel to the direction of the linear movement of the first and second substrates.

3. The method according to claim 1, wherein at least one of said alignment marks is arranged at or on a first substrate holder for holding the first substrate or on a second substrate holder for holding the second substrate.

4. The method according to claim 1, wherein at least two alignment marks are arranged on the first substrate or on the second substrate, and at least one alignment mark is arranged on a first substrate holder for holding the first substrate or on the second substrate holder for holding the second substrate, and
   wherein the alignment marks are arranged parallel to the direction of the linear movement of the first and second substrates.

5. The method according to claim 1, wherein detection units for detecting the alignment marks are arranged in at least one annular measuring portal.

6. The method according to claim 1, wherein detection units for detecting the alignment marks are arranged in at least one fully closed annular measuring portal.

7. The method according to claim 1, wherein detection units for detecting the alignment marks are arranged in two annular measuring portals.

8. The method according to claim 1, wherein detection units for detecting the alignment marks are arranged in two fully closed annular measuring portals.

9. The method according to claim 1, wherein detection units for detecting the alignment marks are arranged in an annular measuring portal.

10. The method according to claim 1, wherein detection units for detecting the alignment marks are arranged in a fully closed annular measuring portal and in a C-shaped column.

11. A device for aligning first and second substrates, said device comprising:
    a first substrate holder for holding the first substrate;
    a second substrate holder for holding the second substrate;
    a first movement device for moving the first substrate holder;
    a second movement device for moving the second substrate holder;
    a first linear guide for the first movement device;
    a second linear guide for the second movement device; and
    detection units for detecting alignment marks on the first and second substrates,
    wherein the first and second substrates are aligned with respect to one another in dependence on detection of the alignment marks by the detection units,
    wherein at least two alignment marks are arranged parallel to a direction of a linear movement of the first and second substrates,
    wherein alignment of the first and second substrates takes place along a single alignment axis, the alignment axis running parallel to a loading and an unloading direction of the first and second substrates, and
    wherein the detection units detect the alignment marks on the first and second substrate along the alignment axis is alignment with the loading and the unloading direction of the first and second substrates.

12. The device according to claim 11, wherein at least three alignment marks are arranged parallel to the direction of the linear movement of the first and second substrates.

13. The device according to claim 11, wherein at least one alignment mark is arranged at or on the first substrate holder or the second substrate holder.

14. The device according to claim 11, wherein at least two alignment marks are arranged on the first substrate or the second substrate, and at least one alignment mark is arranged on the first substrate holder or the second substrate holder, and
    wherein the alignment marks are arranged parallel to the direction of the linear movement of the first and second substrates.

15. The device according to claim 11, wherein the detection units for detecting the alignment marks are arranged in at least one annular measuring portal.

16. The device according to claim 11, wherein the detection units for detecting the alignment marks are arranged in at least one fully closed annular measuring portal.

17. The device according to claim 11, wherein the detection units for detecting the alignment marks are arranged in two annular measuring portals.

18. The device according to claim 11, wherein the detection units for detecting the alignment marks are arranged in two fully closed annular measuring portals.

19. The device according to claim 11, wherein the detection units for detecting the alignment marks are arranged in an annular measuring portal.

20. The device according to claim 11, wherein the detection units for detecting the alignment marks are arranged in a fully closed annular measuring portal, and in a C-shaped column.

* * * * *